(12) United States Patent
Zhu et al.

(10) Patent No.: US 9,691,899 B2
(45) Date of Patent: Jun. 27, 2017

(54) SEMICONDUCTOR STRUCTURE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Haizhou Yin, Poughkeepsie, NY (US); Zhijiong Luo, Poughkeepsie, NY (US)

( * ) Notice: Subject to any disclaimer, the term of this patent is extended or adjusted under 35 U.S.C. 154(b) by 81 days.

(21) Appl. No.: 14/439,179

(22) PCT Filed: Nov. 27, 2012

(86) PCT No.: PCT/CN2012/085359
§ 371 (c)(1),
(2) Date: Jun. 30, 2015

(87) PCT Pub. No.: WO2014/067200
PCT Pub. Date: May 8, 2014

(65) Prior Publication Data
US 2016/0172495 A1   Jun. 16, 2016

(30) Foreign Application Priority Data
Nov. 2, 2012  (CN) .......................... 2012 1 0432008

(51) Int. Cl.
*H01L 21/336* (2006.01)
*H01L 29/78* (2006.01)
(Continued)

(52) U.S. Cl.
CPC ...... *H01L 29/7848* (2013.01); *H01L 21/0243* (2013.01); *H01L 21/0274* (2013.01);
(Continued)

(58) Field of Classification Search
None
See application file for complete search history.

(56) References Cited

U.S. PATENT DOCUMENTS 7,358,551 B2   4/2008   Chidambarrao et al.
8,450,194 B2 *  5/2013   Waite ................ H01L 21/26506
                                                              257/365
(Continued)

FOREIGN PATENT DOCUMENTS

CN   101208786 A   6/2008
CN   101872725 A   10/2010
(Continued)

*Primary Examiner* — Ali Naraghi
(74) *Attorney, Agent, or Firm* — Chen Yoshi Mura LLP

(57) ABSTRACT

A semiconductor structure is provided, comprising a substrate (130), a support structure (131), a base region (100), a gate stack, a spacer (240), and a source/drain region, wherein the gate stack is located above the base region (100), and the base region (100) is supported above the substrate (130) by the support structure (131), wherein the support structure (131) has a sigma-shaped lateral cross-section; an isolation structure (123) is formed below edges on both sides of the base region (100), wherein a portion of the isolation structure (123) is connected to the substrate (130); a cavity (112) is formed between the isolation structure (123) and the support structure (131); and a source/drain region is formed on both sides of the base region (100) and the isolation structure (123). Accordingly, a method for manufacturing the semiconductor structure is also provided.

6 Claims, 13 Drawing Sheets

(51) Int. Cl.
  *H01L 21/8234*   (2006.01)
  *H01L 21/8238*   (2006.01)
  *H01L 29/66*     (2006.01)
  *H01L 29/06*     (2006.01)
  *H01L 29/08*     (2006.01)
  *H01L 21/02*     (2006.01)
  *H01L 21/027*    (2006.01)
  *H01L 21/308*    (2006.01)
  *H01L 21/762*    (2006.01)
  *H01L 29/16*     (2006.01)
  *H01L 29/161*    (2006.01)
  *H01L 29/165*    (2006.01)
  *H01L 29/417*    (2006.01)

(52) U.S. Cl.
  CPC .. *H01L 21/02381* (2013.01); *H01L 21/02433* (2013.01); *H01L 21/02529* (2013.01); *H01L 21/02532* (2013.01); *H01L 21/02639* (2013.01); *H01L 21/308* (2013.01); *H01L 21/76224* (2013.01); *H01L 21/823412* (2013.01); *H01L 21/823425* (2013.01); *H01L 21/823468* (2013.01); *H01L 21/823807* (2013.01); *H01L 21/823814* (2013.01); *H01L 21/823864* (2013.01); *H01L 29/0653* (2013.01); *H01L 29/0688* (2013.01); *H01L 29/0847* (2013.01); *H01L 29/161* (2013.01); *H01L 29/165* (2013.01); *H01L 29/1608* (2013.01); *H01L 29/41783* (2013.01); *H01L 29/6653* (2013.01); *H01L 29/6656* (2013.01); *H01L 29/66636* (2013.01); *H01L 29/7834* (2013.01)

(56) References Cited

U.S. PATENT DOCUMENTS

| | | | |
|---|---|---|---|
| 8,969,164 B2 * | 3/2015 | Zhu | H01L 29/66431 438/218 |
| 2013/0334569 A1 * | 12/2013 | Zhu | H01L 29/66431 257/190 |
| 2016/0172495 A1 * | 6/2016 | Zhu | H01L 21/823412 257/192 |

FOREIGN PATENT DOCUMENTS

| | | |
|---|---|---|
| CN | 102222694 A | 10/2011 |
| CN | 102292811 A | 12/2011 |

* cited by examiner

US 9,691,899 B2

SEMICONDUCTOR STRUCTURE AND METHOD FOR MANUFACTURING THE SAME

CROSS REFERENCE TO RELATED APPLICATION

This application is a national stage application, filed under 35 U.S.C. §371, of PCT Application No. PCT/CN2012/085359, filed on Nov. 27, 2012, entitled "SEMINCONDUCTOR STRUCTURE AND METHOD FOR MANUFACTURING THE SAME", which claimed priority to Chinese Application No. 201210432008.6, filed on Nov. 2, 2012, all of which are hereby incorporated by reference in their entirety.

The present application claims priority benefit of Chinese patent application No. 201210432008.6, filed on 2 Nov. 2012, entitled "SEMICONDUCTOR STRUCTURE AND METHOD FOR MANUFACTURING THE SAME", which is herein incorporated by reference in its entirety.

TECHNICAL FIELD

The present invention relates to the field of semiconductor technology. In particular, the present invention relates to a semiconductor structure and a method for manufacturing the same.

BACKGROUND ART

Industrial demand requires IC circuits to have a higher density and reduced size of MOS transistors. However, the reduction of the size of the MOS transistor results in the emergence of two well-known parasitic effects, i.e., short channel effect emerging as a result of reduction of the gate length and drain induced barrier lowering effect, which may deteriorate electrical properties of devices, such as reduction of gate threshold voltage, increase in power consumption, and signal-to-noise ratio (SNR) decline. Physically, the above effects can be explained as follows: when the transistor is turned off (the gate voltage is zero), static electricity of the source/drain region in a very small device or the voltage applied to the drain on the channel region may reduce the energy barrier of electrons or holes in the channel, and results in a higher turn-off current.

In order to control the short channel effect, more impurity elements such as phosphorus, boron and the like have to be doped in the channel, but which may easily lead to reduction of mobility of carries in the device channel. Moreover, the distribution used to dope dopants into the channel can hardly control the problem of steepness, which may easily result in severe short channel effects; the thickness of gate oxides will also encounter a bottleneck of development, the thinning rate in the gate oxide thickness can hardly keep up with the reducing of the gate width, and gate dielectric leakage is increasing; and critical dimensions continue to shrink, which may easily cause the resistance of the source/region to increase continuously and the power consumption of the device to become greater.

Strained silicon technology can control short channel effects effectively. Strained silicon as a substrate of an MOS transistor has been manufactured. Due to the fact that the lattice constant of silicon germanium is different from monocrystalline silicon, structural strain may be produced in the epitaxial layer of silicon germanium produce so as to form strained silicon. Since the lattice constant of the SiGe layer is greater than that of silicon, mechanical stress is generated in the channel region, which may change the carrier mobility. In a FET, tensile stress can increase electron mobility and reduce hole mobility, and can advantageously improve the performance of NMOS; while compressive stress can increase hole mobility and reduce electron mobility, and can advantageously improve the performance of PMOS.

However, the traditional silicon germanium strained silicon technology also begins to face bottlenecks, which can hardly provide stronger strain to the channel and cannot effectively enhance the performance of the semiconductor device.

SUMMARY OF THE INVENTION

In order to solve the above problems, the present invention provides a semiconductor structure and its manufacturing method, which are advantageous in providing the channel with good stress effect and increasing the steepness of the source/drain region, thereby suppressing the short channel effect.

According to one aspect of the present invention, there is provided a method for manufacturing a semiconductor structure, comprising the following steps:
a) providing a substrate on which a gate stack and a first spacer surrounding the gate stack are formed;
b) removing a portion of the substrate located on both sides of the gate stack to form a device stack;
c) forming a second spacer on both sides of the device stack;
d) using the device stack with the second spacer as a mask to etch the substrate located on both sides of the device stack so as to form a recess located on both sides of the device stack and a support structure below the device stack, wherein by controlling the etching, a lateral cross-section of the recess has a sigma-shape, a vertex of which is projected to below the device stack;
e) forming a first semiconductor layer to fill the recess;
f) removing a portion of the first semiconductor layer located on both sides of the device stack to leave the first semiconductor layer having a certain thickness;
g) in a partial region along a width direction of the device stack, removing the first semiconductor layer located on both sides of the device stack so as to expose the substrate;
h) in the partial region along the width direction of the device stack, forming an isolation structure connected to the substrate below the second spacer and the edges on both sides of the device stack;
i) removing the remaining first semiconductor layer to form a cavity between the support structure and the isolation structure; and
j) removing the second spacer, and forming a source/drain region on both sides of the device stack.

According to another aspect of the present invention, there is further provided a semiconductor structure, comprising a substrate, a support structure, a base region, a gate stack, a spacer, and a source/drain region, wherein:
the gate stack is located above the base region and the base region is supported above the substrate by the support structure;
the support structure has a sigma-shaped lateral cross-section;
an isolation structure is formed below the edges on both sides of the base region, wherein part of the isolation structure is connected to the substrate;
a cavity is formed between the isolation structure and the support structure; and a source/drain region is formed on both sides of the base region and an isolation structure.

Compared with the prior art, the technical solutions provided by the present invention have the following advantages: since a cavity is formed below the channel, the stress of the stress material source/drain region on both sides of the channel can act on the channel more concentratedly, thereby effectively enhancing the impact of stress on the channel carrier mobility and enhancing control on the channel performance; furthermore, the presence of the cavity below the channel is also beneficial to enhance the steepness of the source/drain region, thereby suppressing the short channel effect and improving the performance of the semiconductor devices.

BRIEF DESCRIPTION OF THE FIGURES

By reading the detailed description of the non-limiting embodiments made with reference to the following figures, the other features, objects and advantages of the present invention will become more apparent.

DESCRIPTION OF THE PREFERRED EMBODIMENTS

The embodiments of the present invention are described in detail below.

Illustrative examples of the embodiments are shown in the figures, and the same or similar reference numbers denote the same or similar components or components having the same or similar functions. The examples described with reference to the figures below are exemplary for explaining the present invention only, and cannot be construed as limiting the present invention. The following disclosure provides many different embodiments or examples to achieve different structures of the present invention. In order to simplify the disclosure of the present invention, members of specific examples and settings thereof will be described hereinafter. Of course, they are merely exemplary, and are not intended to limit the present invention. In addition, numbers and/or letters in the present invention can be repeated in different examples. Such repetition is for the purpose of simplification and clarity, which itself does not indicate the relationship between various embodiments and/or settings discussed. Further, the present invention provides examples of a variety of particular processes and materials, but those skilled in the art may be aware of applicability of other processes and/or the use of other materials. In addition, the structure where the first feature is "above" the second feature described below may include an embodiment where the first and second features are formed to be in direct contact, and may also include an embodiment where additional features are formed between the first and second features, so that the first and second features may not be in direct contact.

Figure 15:
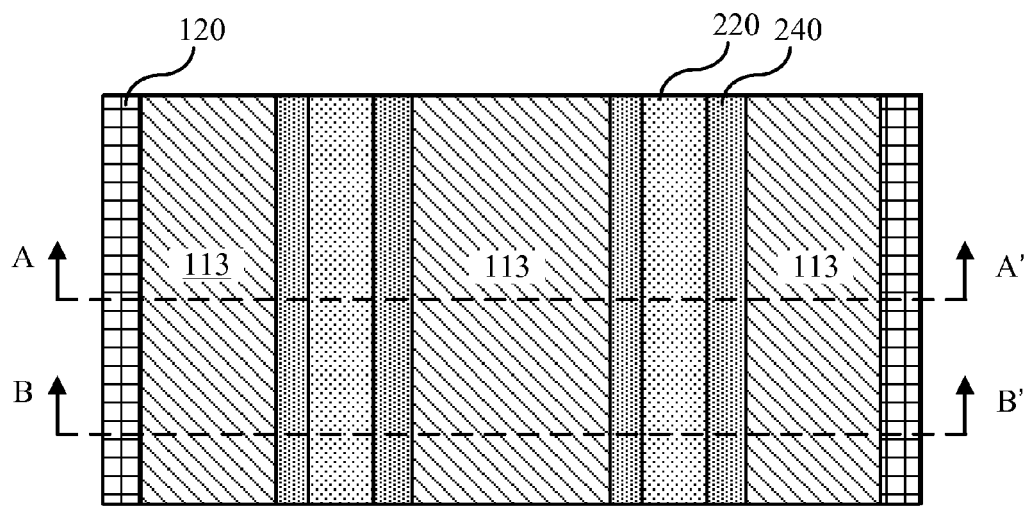
FIG. 15 is a schematic top view after filling stress materials on both sides of the gate stack.
Figure 15A:
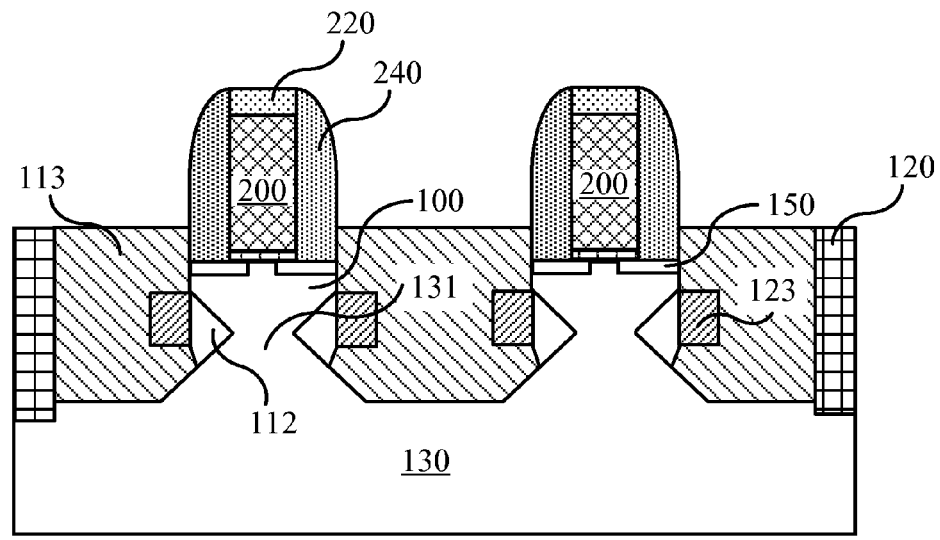
FIGS. 15a and 15b are cross-sectional views of FIG. 15 along the sectional line AA' and along the sectional line BB', respectively.
Figure 15B:
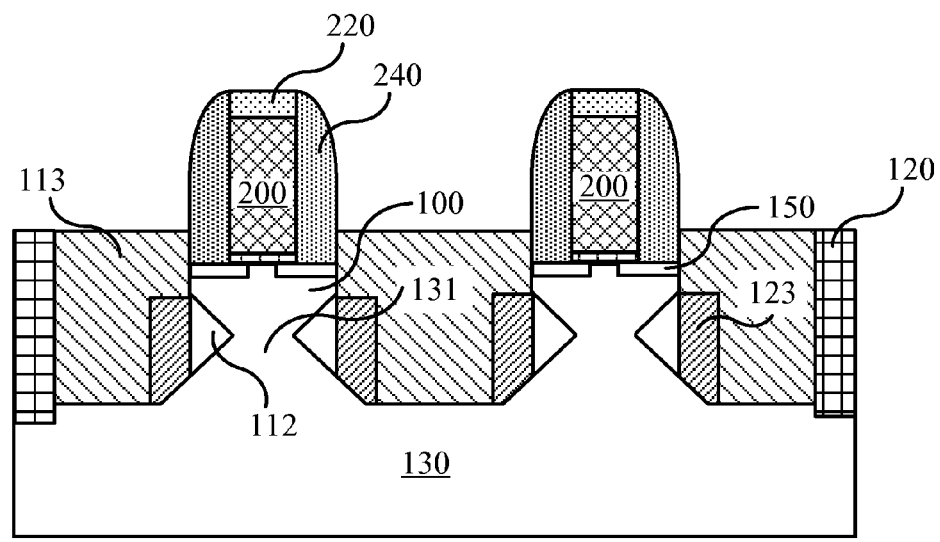

According to one aspect of the present invention, there is provided a semiconductor structure (please refer to FIG. 15, FIG. 15a and FIG. 15b). FIG. 15 is a schematic top view of the semiconductor structure, and FIGS. 15a and 15b are schematic top views of FIG. 15 along sectional line AA' and sectional line BB', respectively. As shown in the figures, the semiconductor structure comprises a substrate 130, a support structure 131, a base region 100, a gate stack, a spacer 240, and a source/drain region, wherein the gate stack is located above the base region 100, and the base region 1100 is supported on the substrate 130 by a support structure 131; the lateral cross-section of the support structure has a Sigma (Σ) shape; an isolation structure 123 is formed below the edges on both sides of the base region 100, wherein part of the isolation structure 123 is connected to the substrate 130; a cavity 112 is formed between the isolation structure 123 and the support structure 131; and a source/drain region is formed on both sides of the base region 100 and the isolation structure 123.

Specifically, in the present embodiment, the material of the substrate 130 is a monocrystalline Si; in other embodiments, the material of the substrate 130 may be any other monocrystalline semiconductor material. The substrate 130 has a thickness in the range of 0.1 nm to 2 mm. In the present embodiment, the crystal orientation of the substrate 130 is <100>.

The base region 100 is supported above the substrate 130 by a support structure 131. The channel of the semiconductor structure is formed in the base region 100. In this present embodiment, the material of the base region 100 is monocrystalline Si; and in other embodiments, the material of the base region 100 may be any other suitable materials. The base region 100 has a thickness in the range of 10 nm to 30 nm. According to FIG. 15a and FIG. 15b, it can be seen that the base region 100 and the support structure 131 are projected on the substrate 130 and are integrated with the substrate 130, and are formed by etching the substrate 130.

Part of the isolation structure 123 is connected to the substrate 130, i.e., there is a certain distance between part of the isolation structure 123 and the substrate 130 as they are not in direct contact. Since the lateral cross-section of the support structure 131 has a Sigma (Σ) shape, the isolation structure 123 together with the support structure 131 located between the base region 100 and the substrate 130 surround a cavity 112. In the present embodiment, the isolation structure 123 and the material of the substrate 130 and the base region 100 may be formed by the same material, i.e., monocrystalline Si. In other embodiments, the material of the isolation structure 123 may be any other suitable semiconductor materials.

The gate stack comprises a gate dielectric layer 102, a gate 200, and a cap layer 220, wherein the gate dielectric layer 102 is located above the base region 100, the gate 200 is located above the gate dielectric layer 102, and the cap layer 220 is located above the gate 200 for protecting the gate 200 from being damaged in subsequent steps. The material of the gate 200 can be selected from Poly-Si, Ti, Co, Ni, Al, W, alloys, metal silicides, or any combination thereof. The gate dielectric layer 102 may be a thermal oxide layer including silicon oxide or silicon oxynitride, or can be a high K dielectric, such as one of $HfO_2$, HfSiO, HfSiON, HfTaO, HfTiO, HfZrO, $Al_2O_3$, $La_2O_3$, $ZrO_2$, LaAlO, or any combination thereof. The gate dielectric layer 220 may have a thickness of 2 nm to 10 nm, for example, 5 nm or 8 nm. The cap layer 220 can be selected from nitrides of silicon and has a thickness in the range of 10 nm to 40 nm, for example, 10 nm or 20 nm. The spacer 240 (which is also referred to as "a first spacer") surrounds the sidewalls of the gate dielectric layer 102, the gate 200 and the cap layer 220. The material of the first spacer 240 comprises one of silicon nitride, silicon oxide, silicon oxynitride, silicon carbide, or any combination thereof, and/or other suitable materials. The spacer 240 may have a monolayer structure, or may have a multilayer structure. The spacer 240 has a thickness in the range of 10 nm to 100 nm, for example, 30 nm, 50 nm or 80 nm.

The source/drain region 113 is located on both sides of the gate stack with a spacer 240, the base region 100 and the isolation structure 123. The upper surface of the source/drain region is higher than or at the same level as the bottom of the gate stack. As for PFET devices, the material of the source/drain region 113 is boron-doped $Si_{1-x}Ge_x$, wherein X ranges from 0.1 to 0.7, such as 0.2, 0.3, 0.4, 0.5 or 0.6; and as for NFET devices, the material of the source/drain region 113 is phosphorus or arsenic-doped Si:C, wherein the percentage of C ranges from 0.2% to 2%, such as 0.5%, 1% or 1.5%. The presence of the stress material silicon germanium or silicon carbide is advantageous for further regulating the stress within the channel region so as to enhance mobility of carriers within the channel region. Besides, due to the presence of silicon germanium or silicon carbide, for PFET devices, an N-type super steep retrograde well structure is formed; and for NFET devices, a P-type super steep retrograde well structure is formed.

Preferably, the semiconductor structure provided by the present invention comprises a source/drain extension region 150, which is located in a portion of the base region 100 adjacent to the source/drain region.

The semiconductor structure provided in the present invention has the following advantages: since a cavity is formed below the channel, the stress of the silicon germanium or silicon carbide on both sides of the channel may more centrally apply to the channel, thereby effectively enhancing the impact of the channel on the mobility of the carrier and enhancing the control on the performance of the channel. Besides, the presence of the cavity below the channel is also advantageous for enhancing the steepness of the source/drain region, thereby suppressing the short channel effect and enhancing the performance of the semiconductor device.

Figure 1:
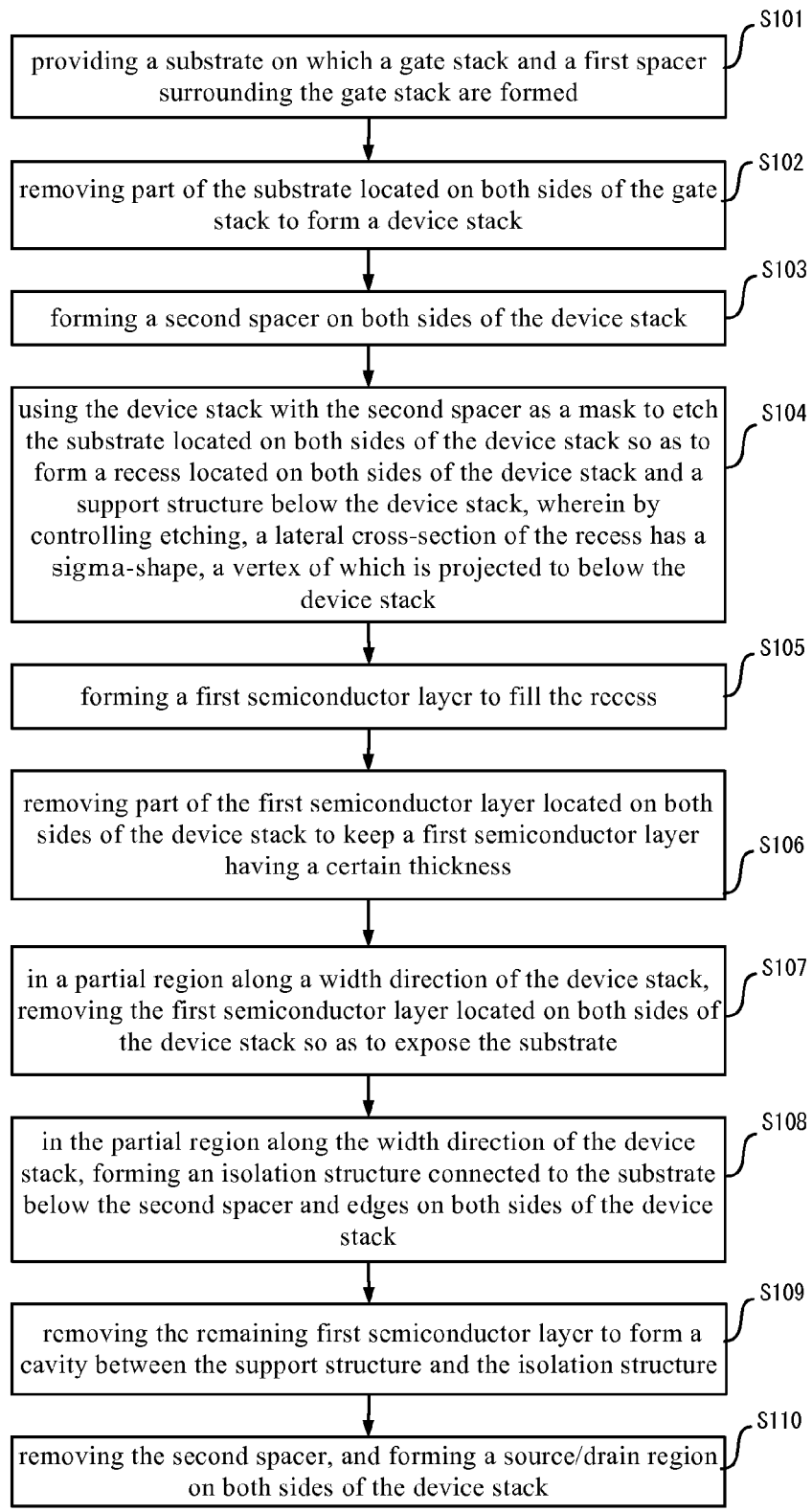
FIG. 1 is a flowchart of a method of manufacturing a semiconductor structure according to the invention.

According to another aspect of the present invention, there is further provided a method of manufacturing a semiconductor structure. The method of forming a semiconductor structure of FIG. 1 is described in detail below through one embodiment of the present invention in combination with FIG. 2 to FIG. 15b. As shown in FIG. 1, the manufacturing method provided by the present invention comprises the following steps:

In step S101, providing a substrate 130 on which a gate stack and a first spacer 240 surrounding the gate stack are formed.

Figure 2:
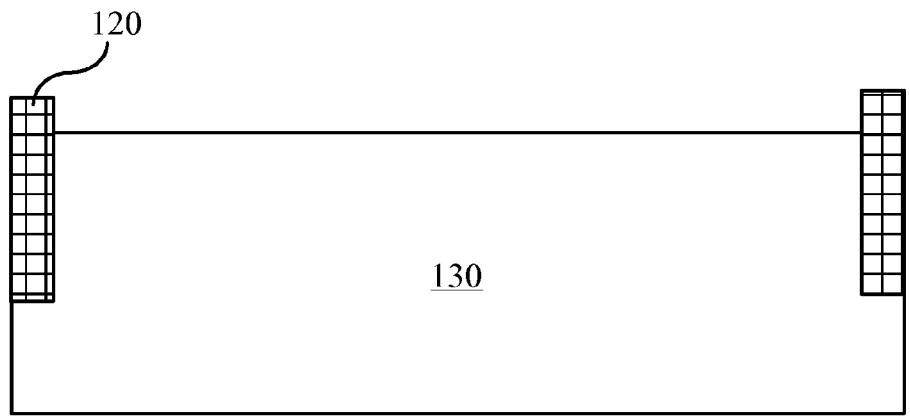
FIG. 2 is a schematic cross-sectional view of a substrate.

Specifically, as shown in FIG. 2, a substrate 130 is first provided, wherein in the present embodiment, the material of the substrate 130 is monocrystalline Si; in other embodiments, the material of the substrate 130 may be any other monocrystalline semiconductor material. In the present embodiment, the crystal orientation of the substrate 130 is <100>. As stated below, this would facilitate anisotropic etching of the substrate 130. The substrate 130 has a thickness in the range of 0.1 nm to 2 mm. Typically, an isolation structure, for example, a shallow trench isolation (STI) structure 120, is formed in the substrate 130, so as to electrically isolate multiple semiconductor devices.

Figure 3:
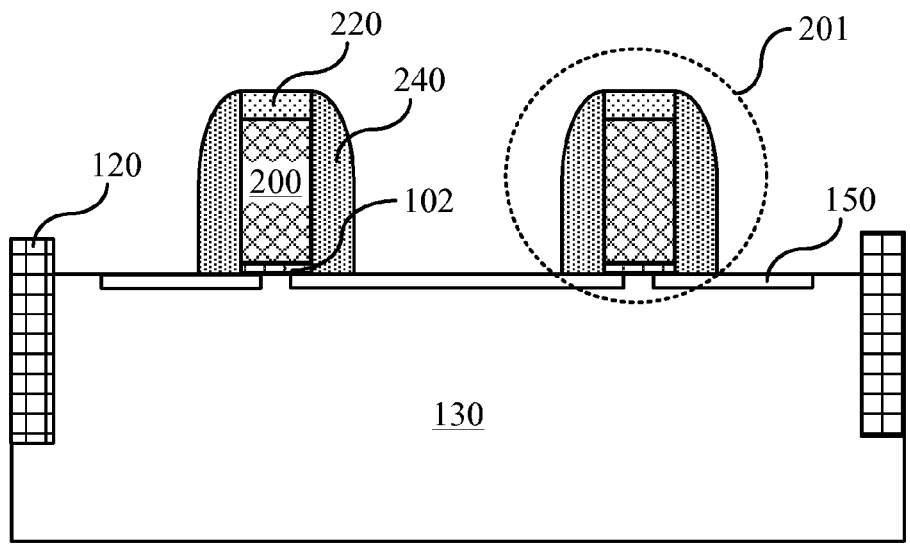
FIG. 3 is a schematic cross-sectional view after forming a gate stack.

Next, as shown in FIG. 3, a gate dielectric layer 102, a gate 200 and a cap layer 220 are sequentially formed on the substrate 130 to constitute a gate stack, wherein the gate dielectric layer 102 is located on the substrate 130, the gate 200 is located on the gate dielectric layer 102, and the cap layer 220 is located above the gate 200 to protect the gate 200 from being damaged in subsequent steps. The material of the gate electrode 200 can be selected from Poly-Si, Ti, Co, Ni, Al, W, alloys, metal silicides, or any combinations thereof. The gate dielectric layer 102 may be a thermal oxide layer including silicon oxide or silicon oxynitride, or can be a high K dielectric, such as one of $HfO_2$, HfSiO, HfSiON, HfTaO, HfTiO, HfZrO, $Al_2O_3$, $La_2O_3$, $ZrO_2$, LaAlO, or any combination thereof. The gate dielectric layer 102 may have a thickness of 2 nm to 10 nm, for example, 5 nm or 8 nm. The cap layer 220 may be selected from silicon nitride and has a thickness in the range of 10 nm to 40 nm, for example, 10 nm or 20 nm. After forming a gate stack, the surface of the substrate located on both sides of the gate stack is lightly doped for forming a source/drain extension region 150. As for PFET devices, P-type dopants, such as boron and indium, are doped into the substrate 130; as for NFET devices, N-type dopants, such as arsenic and phosphorus, are doped into the substrate 130. After forming a source/drain extension region 150, a first spacer 240 surrounding the sidewalls of the gate dielectric layer 102, the gate 200 and the cap layer 220 is formed. The material of the spacer 240 comprises one of silicon nitride, silicon oxide, silicon oxynitride, silicon carbide, or any combination thereof, and/or other suitable materials. The spacer 240 may have a monolayer structure, and may also have a multilayer structure. The spacer 240 has a thickness in the range of 10 nm to 100 nm, for example, 30 nm, 50 nm or 80 nm.

In step S102, part of the substrate 130 located on both sides of the gate stack is removed to form a device stack.

Figure 4:
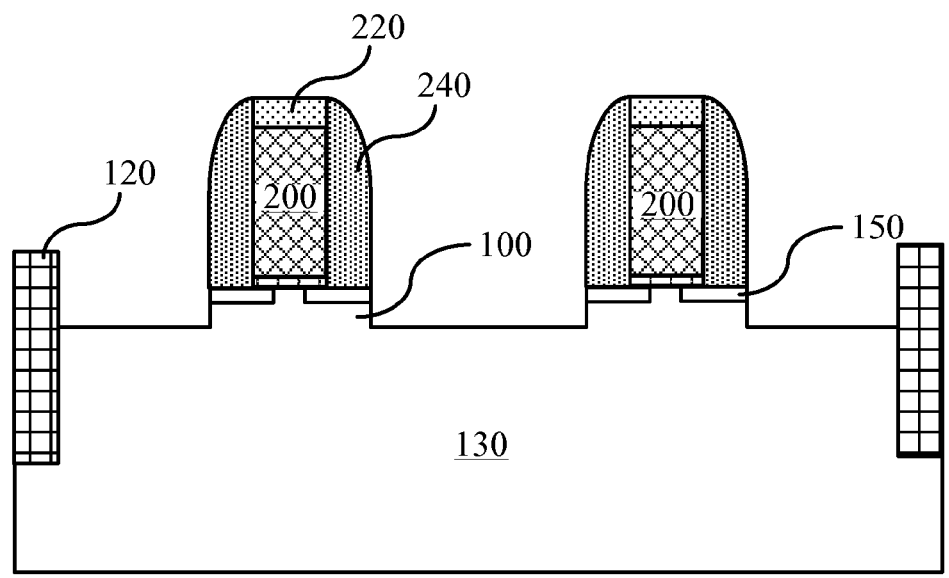
FIG. 4 is a schematic cross-sectional view after forming a device stack.

Specifically, as shown in FIG. 4, the gate stack with a spacer 240 is used as a mask to etch and remove part of the substrate 130 on both sides of the gate stack to form a base region 100 below the gate stack. The base region 100 and the gate stack above as well as the first spacer 240 together form a device stack. In the present embodiment, the etching depth is in the range of 10 nm to 30 nm. The etching is preferably dry etching comprising plasma etching, ion milling, reverse sputtering, and reactive ion etching. In the present embodiment, reactive ion etching is employed.

In step S103, a second spacer 260 is formed on sidewalls of the device stack.

Figure 5:
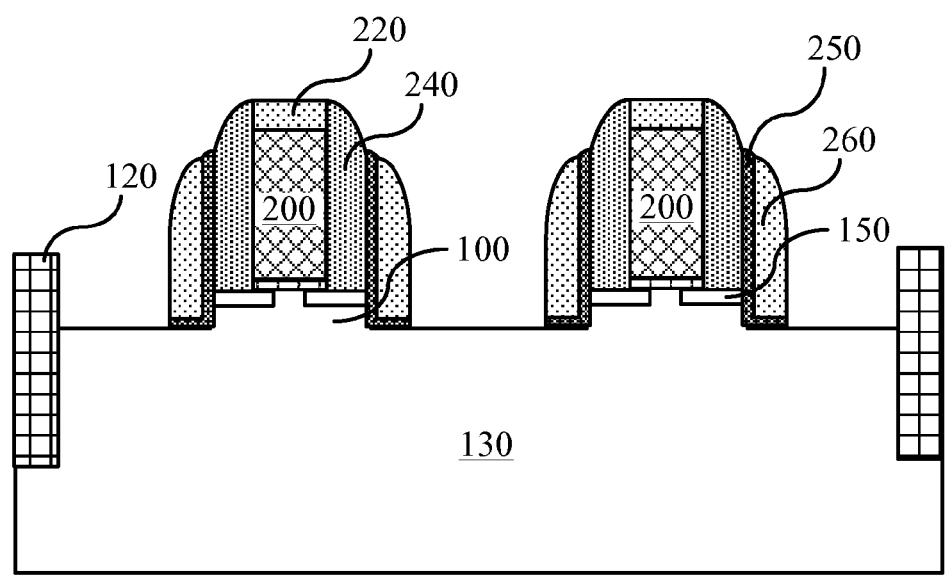
FIG. 5 is a schematic cross-sectional view after forming a stop layer and a second spacer on side surfaces of the device stack.

Specifically, as shown in FIG. 5, a first insulation layer (not shown) is deposited on the entire semiconductor structure, and then a second insulation layer (not shown) is deposited on the first insulation layer. Then, the second insulation layer and the first insulation layer are etched to form an etching stop layer 250 surrounding the device stack and a spacer 260 (which is referred to as a second spacer 260 hereinafter) surrounding the etching stop layer 250. The material of the second spacer 260 comprises one of silicon nitride, silicon oxide, silicon oxynitride, silicon carbide, or any combination thereof, and/or other suitable materials, its thickness being in the range of 5 nm to 10 mm. The material of the etching stop layer 250 is preferably an insulating material different from the first spacer 240 and the second spacer 260. For example, the material of the first spacer 240 and the second spacer 260 is silicon nitride, while the material of the etching stop layer 250 is silicon oxide. The etching stop layer 250 has a thickness in the range of 1 nm to 3 nm.

In step S104, the device stack with a second spacer 260 is used as a mask to etch the substrate 130 located on both sides of the device stack, so as to form a recess 160 located on both sides of the device stack and a support structure below the device stack. By controlling the etching, the lateral cross-section of the recess may have a sigma-shape, the vertex of which is projected to below the device stack.

Figure 6:
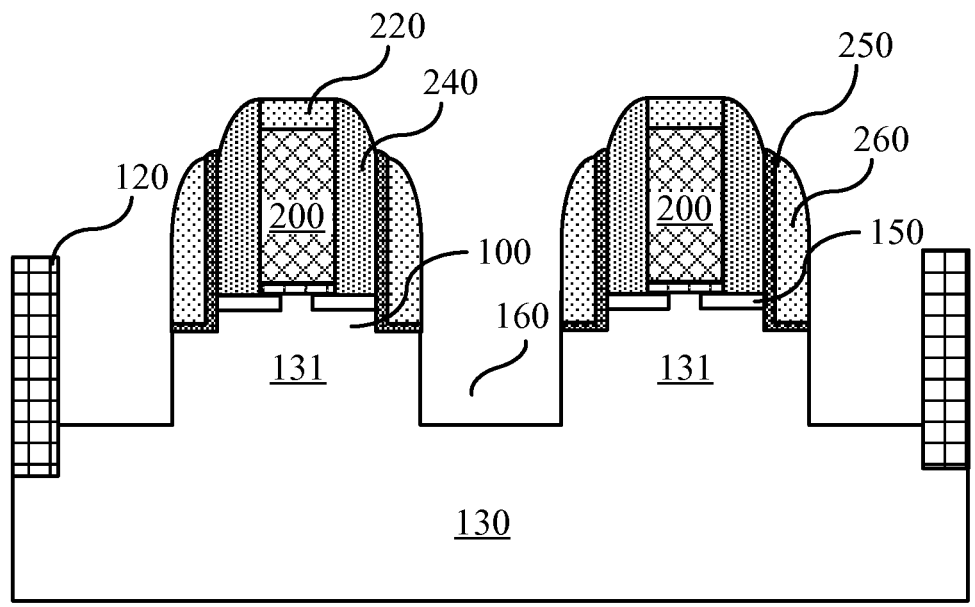
FIG. 6 is a schematic cross-sectional view after forming a recess on both sides of the device stack.

Specifically, as shown in FIG. 6, the device stack with a spacer 260 is used as a mask to etch part of the substrate 130 located on both sides of the device stack by anisotropic etching, so as to form a recess 160 located on both sides of the device stack and a support structure 131 below the base region 100. In the present embodiment, the etching method is preferably dry etching RIE. By adjusting and controlling the gas flow, components and power consumption of the RIE apparatus, a recess 160 with almost steep sidewalls and a support structure 131 can be obtained.

Figure 7:
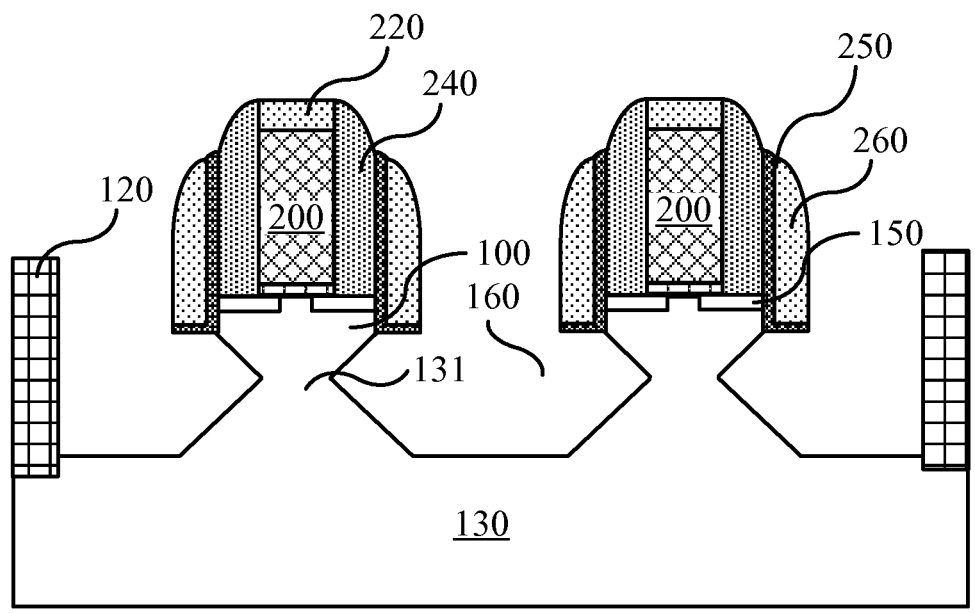
FIG. 7 is a schematic cross-sectional view after further etching to form a Sigma-shaped recess, with the vertex of its sidewalls being projected to below the stack device.

Then, as shown in FIG. 7, anisotropic wet etching having selectivity to crystal orientation is used to further etch the bottom surface of the recess 160 and the sidewalls of the recess 160 and the support structure 131, so that the lateral cross-section of the recess 160 has a SIGMA-shape, the vertex of which is projected to below the device stack. In the present embodiment, the crystal orientation of the substrate 130 is <100>, the etching solution for wet etching can be potassium hydroxide (KOH), tetramethyl ammonium hydroxide (TMAH) or ethylenediamine-pyrocatechol (EDP), etc., or any combination thereof, and the etching solution has a concentration of about 5 to 40 mass percent and a reaction temperature from 40° C. to 90° C. Since etching solutions such as KOH and TMAH may anisotropically etching monocrystalline Si, and the etching rate ratio of etching crystal face {111} to etching other crystal faces is 1:100, it substantially does not etch the {111} crystal face. As shown in FIG. 7, the sidewalls of the recess 160 are etching stop surfaces, and the crystal faces are {111}. Thus, by anisotropic etching, the lateral cross-section of the recess has a sigma-shape, the vertex of which is projected to below the device stack. Correspondingly, the lateral cross-section of the support structure 131 has a concave Sigma-shape. Furthermore, since the crystal orientation of the bottom of the recess is <100>, the recess 160 may be deepened by wet etching.

In step S105, a first semiconductor layer 110 is formed to fill the recess.

Figure 8:
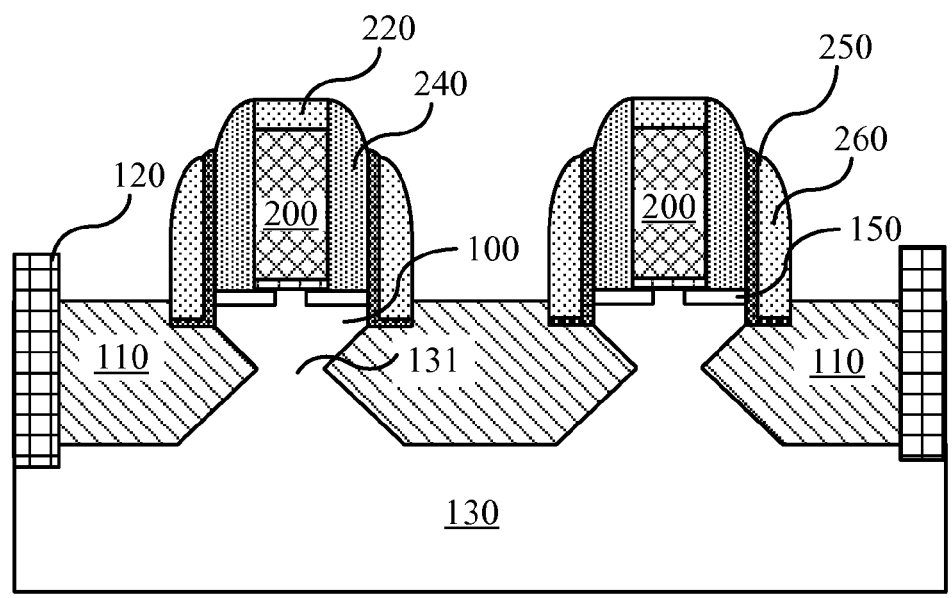
FIG. 8 is a schematic cross-sectional view after filling the recess to form a semiconductor layer.

Specifically, as shown in FIG. 8, the recess located on both sides of the device stack with a second spacer 260 is filled by selective epitaxial growth to form a semiconductor layer 110 (which is referred to as a first semiconductor layer 110). In the present embodiment, the material of the first semiconductor layer 110 is SiGe. The proportion of element Ge is between 10% and 20%. It should be noted that the upper surface of the first semiconductor layer 110 is not lower than the lower surface of the etching stop layer 250. In addition, as shown in FIG. 8, the lateral cross-section of the recess 160 has a sigma-shape, the vertex of which is projected to below the device stack.

In step S106, part of the first semiconductor layer 110 located on both sides of the device stack is removed and the first semiconductor layer 110 having a certain thickness is retained.

Figure 9:
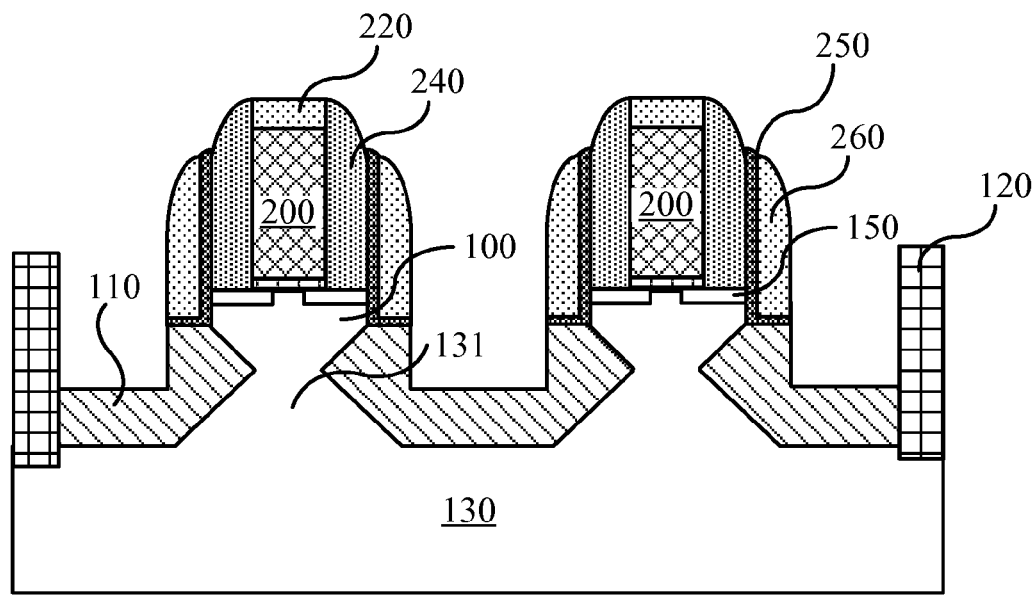
FIG. 9 is a schematic cross-sectional view after etching part of the semiconductor layer.

Specifically, as shown in FIG. 9, the device stack with a second spacer 260 is used as a mask, and a process such as dry etching is used to etch the first semiconductor layer 110 located on both sides of the second spacer 260. During the etching process, the first semiconductor layer 110 is not completely removed. Instead, the first semiconductor layer 110 having a certain thickness is retained on both sides of the second spacer 260. In addition, since the etching is anisotropic (i.e., the etching is performed substantially in the vertical direction), a portion of the first semiconductor layer 110, which is projected to below the device stack, is retained.

In step S107, in a partial region of the device stack along the width direction, the first semiconductor layer 110 located on both sides of the device gate is removed so as to expose the substrate 130. The above width is defined based on the channel of the semiconductor device to be formed. The direction along which the current flows in the channel is a length direction, and the direction vertical thereto is a width direction. Namely, the left-right direction in FIG. 10 is a longitudinal direction, and the direction perpendicular thereto on the paper sheet is a width direction.

Figure 10:
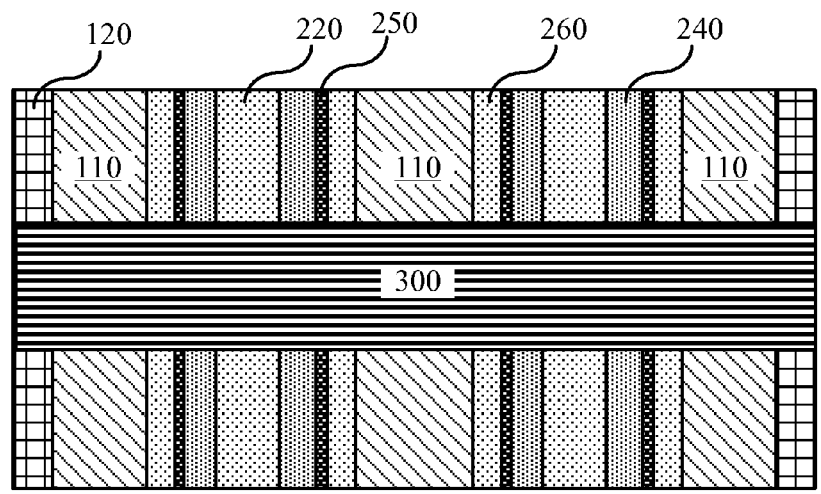
FIG. 10 is a schematic top view after covering a photolithographic mask.

Specifically, in the present embodiment, as shown in FIG. 10, a photolithographic mask 300 is formed on the semiconductor structure to cover the middle portion and expose the end portion of the semiconductor structure in the width direction, so that the first semiconductor layer 110 below the photolithographic mask 300 is not etched in subsequent steps. The material of the photolithographic mask 300 may be a photoresist, an organic polymer, silicon oxide, silicon nitride, borosilicate glass, borophosphosilicate glass, or any combination thereof. The method of forming a photolithographic mask 300 is well known to those skilled in the art. For the sake of brevity, further detailed description is omitted here. The function of the photolithographic mask 300 is to protect the middle portion in the width direction of the semiconductor structure and part of the first semiconductor layer 110 on both sides of the device stack. That is, after etching the first semiconductor layer 110 which is not covered by the photolithographic mask 300 in subsequent steps, part of the first semiconductor layer 110 is retained on both sides of the device stack in the middle portion in the width direction of the semiconductor structure. As will be described below, the position of the photolithographic mask 300 is not only limited to the position as shown in FIG. 10. Any photolithographic mask 300 in a partial region along the width direction of the semiconductor structure that can cover the first semiconductor layer 110 located on both sides of the gate stack is suitable for the manufacturing method provided by the present invention, which is not enumerated herein.

Figure 11:
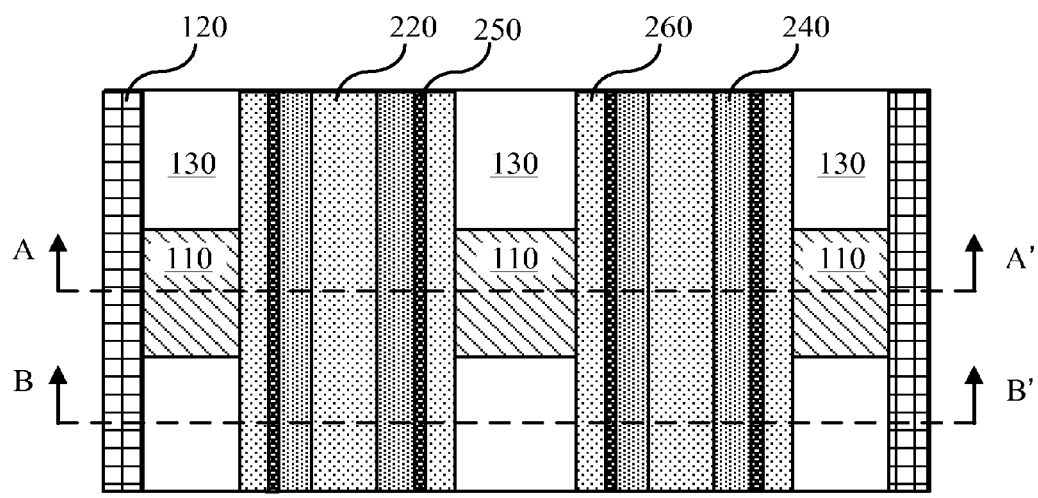
FIG. 11 is a schematic top view of etching the semiconductor layer to expose part of the substrate and removing the photolithographic mask.
Figure 11A:
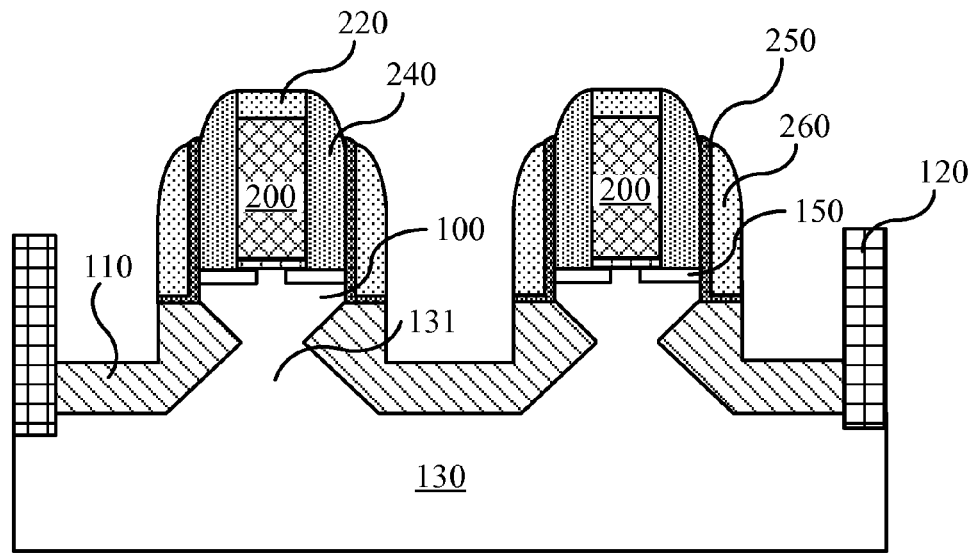
FIGS. 11a and 11b are schematic cross-sectional views of FIG. 11 along a sectional line AA' and along a sectional line BB', respectively.
Figure 11B:
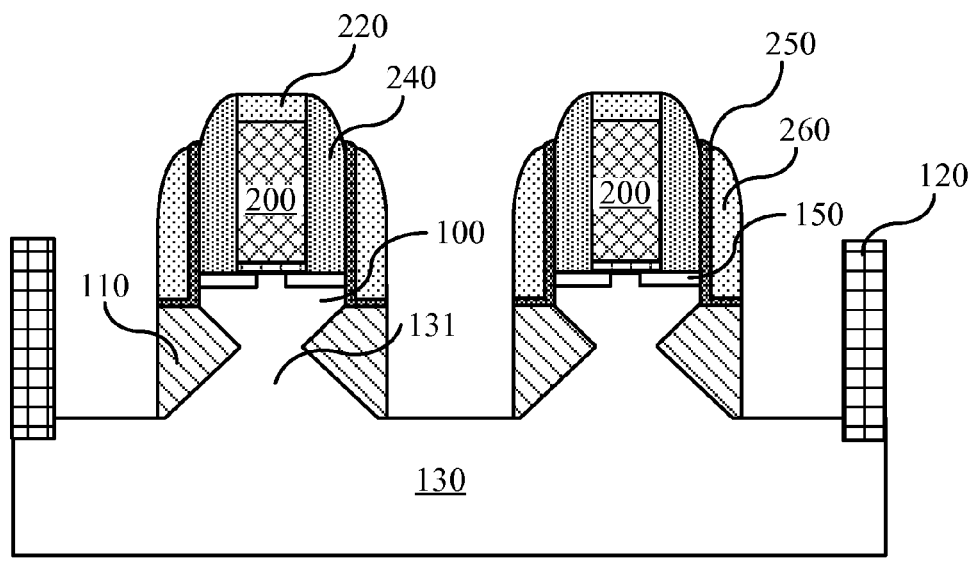

Then, the photolithographic mask 300 and the device stack with a second spacer 260 are used as a mask and the substrate 130 is used as an etching stop layer, so as to etch the first semiconductor layer 110 outsides the gate stack and the second spacer 260 in both end regions in the width direction of the device stack (in other embodiments, in the region not covered by the photolithographic mask 300 in the width direction of the device stack) until the substrate 130 is exposed. Then, the photolithographic mask 300 is removed. Please refer to FIG. 11, 11a and FIG. 11b. FIG. 11 is a top sectional view after etching the first semiconductor layer 110 to expose part of the substrate and removing the photolithographic mask 300, and FIG. 11a and FIG. 11b are schematic sectional views of FIG. 11 along the sectional line AA' and along the sectional line BB', respectively. As shown in FIG. 11a, the first semiconductor layer 110 located in the middle portion in the width direction of the semiconductor structure and on both sides of the second spacer 260 and covered by the photolithographic mask 300 is retained, while the second semiconductor layer 110 located in both end regions in the width direction of the semiconductor structure and on both sides of the spacer 260 and not covered by the photolithographic mask 300 is removed, so as to expose the substrate 130, as shown in FIG. 11b. Since the etching is substantially anisotropic (i.e., the etching is performed substantially in the vertical direction), the portion of the first semiconductor layer 110 that is projected to below the device stack is retained.

In step S108, in the partial region along the width direction of the device stack, an isolation structure 123 connected to the substrate is formed below the spacer 260 and the end portions on both sides of the device stack.

Figure 12:
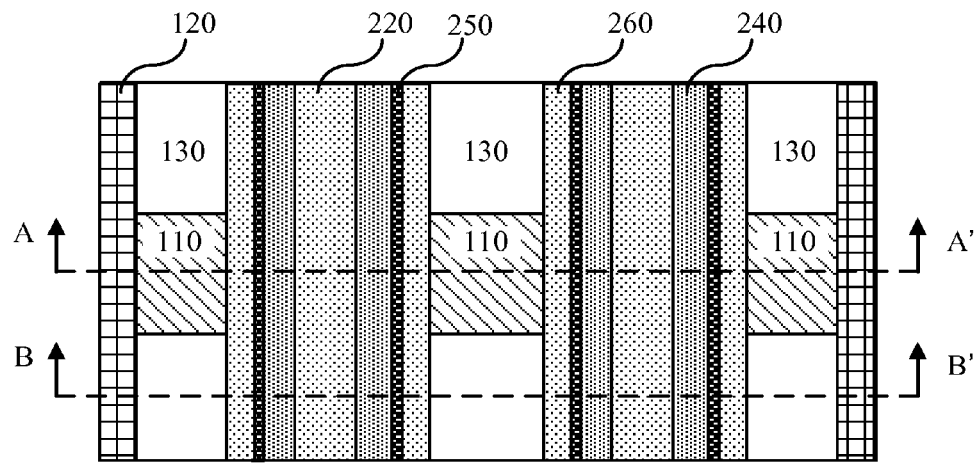
FIG. 12 is a schematic top view after lateral selective etching of the semiconductor layer.
Figure 12A:
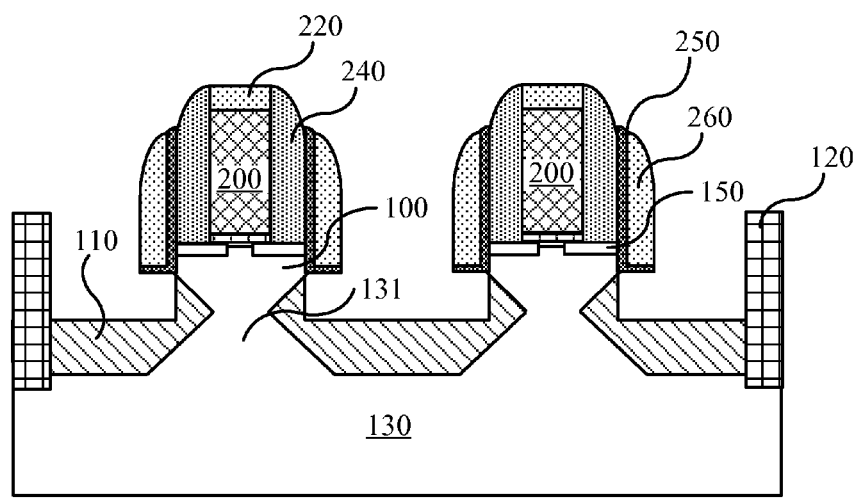
FIGS. 12a and 12b are cross-sectional views of FIG. 12 along the sectional line AA' and along the sectional line BB', respectively.
Figure 12B:
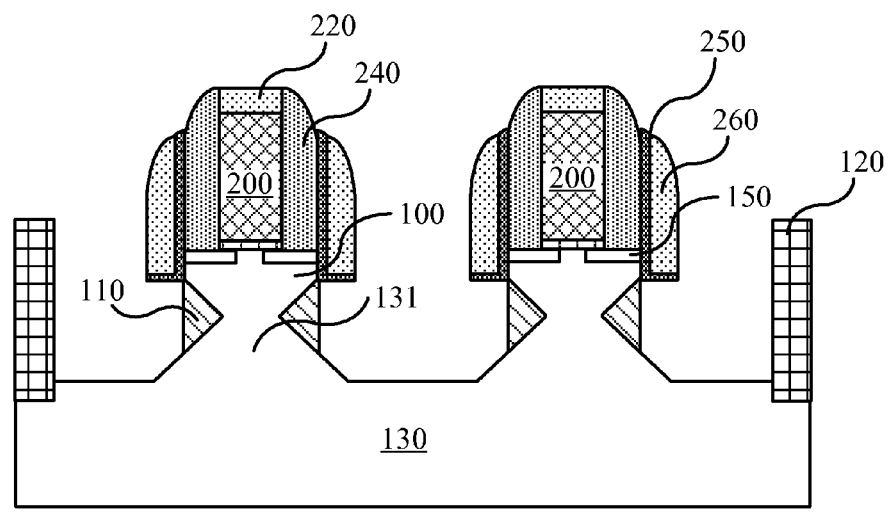

Specifically, as shown in FIG. 12, FIG. 12a and FIG. 12b, FIG. 12 is a schematic top view after selectively etching the first semiconductor layer 110 laterally, and FIGS. 12a and 12b are schematic sectional views of FIG. 12 along the section line AA' and along the sectional line BB', respectively. As shown in the figures, the first semiconductor layer 110 located below the gate stack and the second spacer 260 is etched back. By controlling etching time, the etched lateral depth is slightly greater than the sum of the thickness of the second spacer 260 and the etching stop layer 250.

Figure 13:
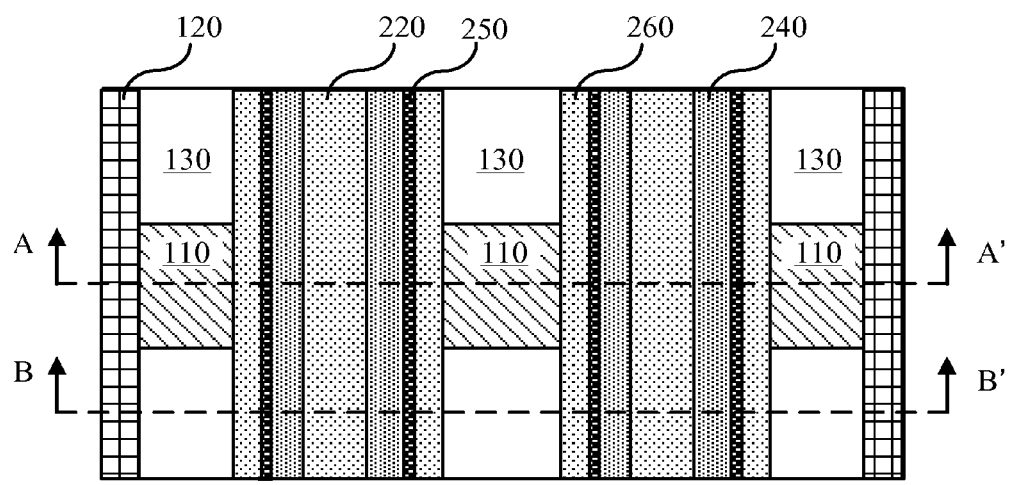
FIG. 13 is a schematic top view after forming an isolation structure.
Figure 13A:
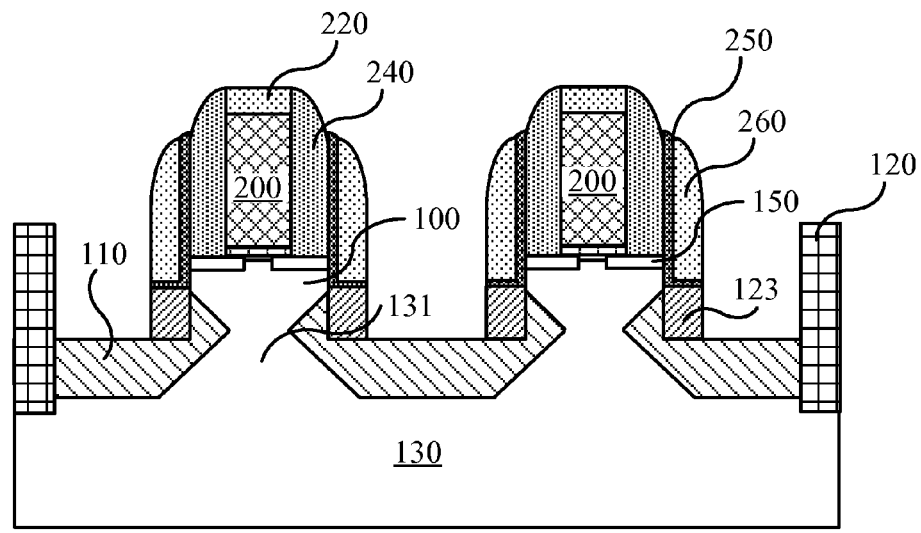
FIGS. 13a and 13b are cross-sectional views of FIG. 13 along the sectional line AA' and along the sectional line BB', respectively.
Figure 13B:
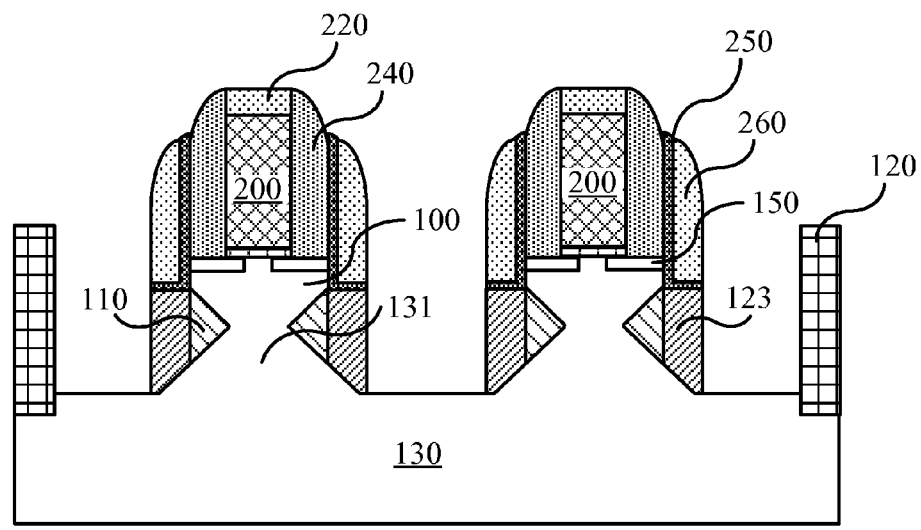

Next, as shown in FIG. 13, FIG. 13a and FIG. 13b, FIG. 13 is a schematic top view after forming an isolation structure, and FIGS. 13a and 13b are schematic sectional views of FIG. 13 along the section line AA' and along the sectional line BB', respectively. As shown in the figures, for example, a second semiconductor layer (not shown) is formed on the upper surface of the exposed substrate 130 and on the upper surface and sidewalls of the first semiconductor layer 110 by a method of epitaxial growth, and the second semiconductor layer located on the upper surface of the exposed substrate 130 and on the upper surface of the first semiconductor layer 110 is removed by anisotropic etching (such as RIE, i.e., the etching is performed substantially in the vertical direction), while the second semiconductor layer located below the device stack with a second spacer 260 (mainly located below the second spacer 260) is retained to form an isolation structure 123. Laterally, the isolation structure 123 is substantially located below the second spacer 260 and the edges of the two sides of the device stack. In the present embodiment, the material of the isolation material 123 is monocrystalline silicon. In other embodiments, the material of the isolation structure 123 may be any other semiconductor material that is different from the first semiconductor layer 110. As shown in FIG. 13a, since in the middle portion in the width direction of the semiconductor structure, the first semiconductor layer 110 is not etched completely under the protection of the photolithographic mask 300 (please refer to FIG. 10). When a support isolation structure 123 is formed on the sidewalls of the first semiconductor layer 110 covered previously by the photolithographic mask 300, the support isolation structure 123 is formed on the first semiconductor layer 110, i.e., a first semiconductor layer 110 is formed between the support isolation structure 123 and the substrate 130. However, as shown in FIG. 13b, in the end regions in the width direction of the semiconductor structure not protected by the photolithographic mask 300, the etching stops at the surface of the substrate 130. Thus, while forming the support isolation structure 123, there is no first semiconductor layer 110 below, i.e., the support isolation structure 123 is directly formed on the substrate 130 and is connected to the substrate 130. Although the present embodiment illustrates the example where a support isolation structure 123 is formed in end regions in the width direction of the semiconductor structure, those skilled in the art shall understand that the specific position of the support isolation structure 123 is not limited to this. For example, those skilled in the art may understand that as long as it is connected to the substrate and the object of forming a cavity can be subsequently achieved, the support isolation structure 123 can be located at any position in the width direction of the semiconductor structure. For the sake of simplicity, no further comment is made herein. As shown in the figures, between the isolation structure 123 and the support structure 131, there exists a portion of the first semiconductor layer 110 that is not etched and is projected to below the device stack.

In step S109, the remaining first semiconductor layer 110 is removed and a cavity 112 is formed between the support structure 131 and the isolation structure 123.

Figure 14:
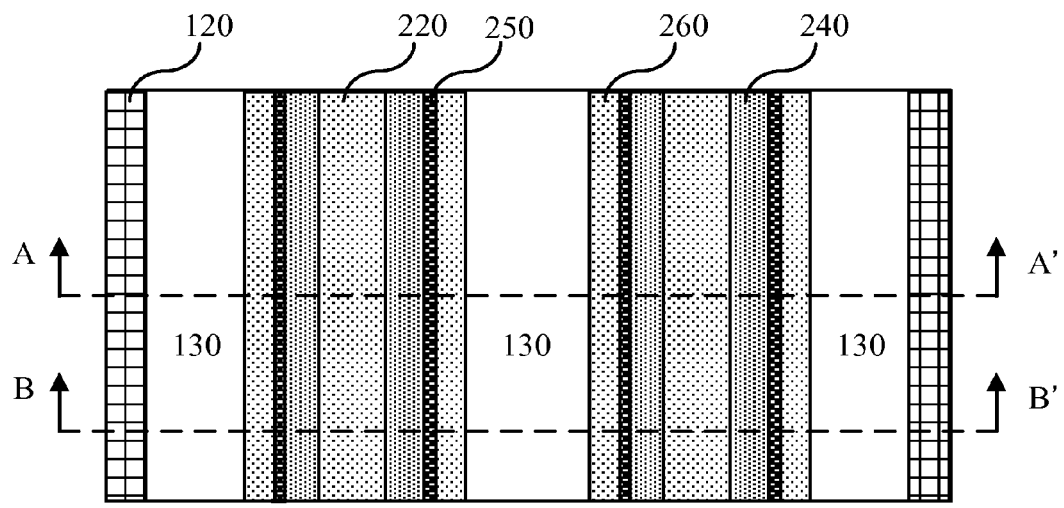
FIG. 14 a schematic top view after removing the semiconductor layer to form a cavity below the gate stack.
Figure 14A:
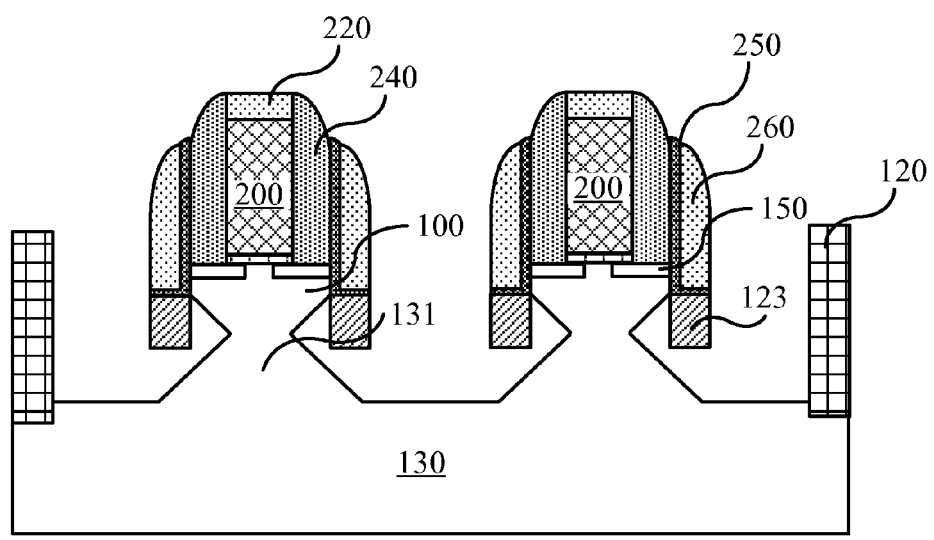
FIGS. 14a and 14b are cross-sectional views of FIG. 14 along the sectional line AA' and along the sectional line BB', respectively.
Figure 14B:
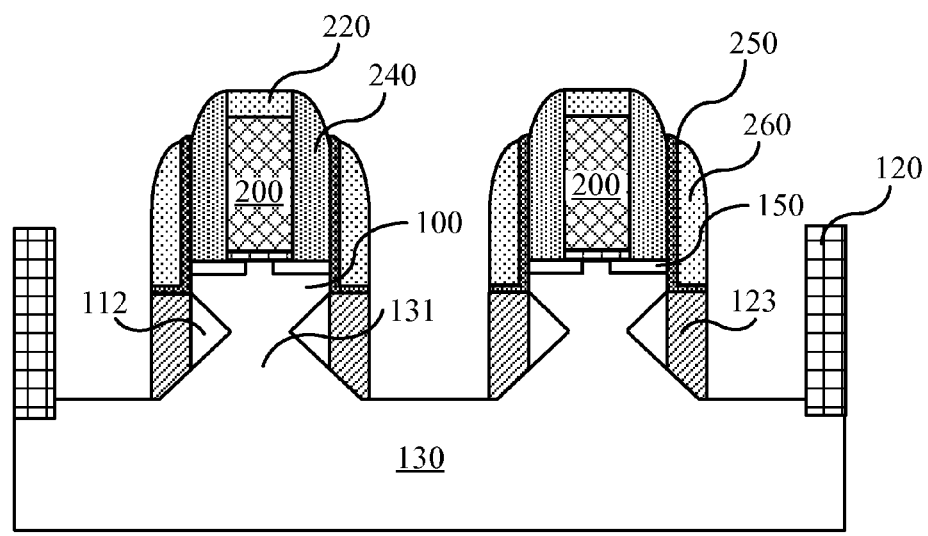

Specifically, as shown in FIG. 14, FIG. 14a and FIG. 14b, FIG. 14 is a schematic top view after removing a first semiconductor layer 110 to form a cavity 112 below the gate stack, and FIG. 14a and FIG. 14b are schematic sectional views of FIG. 14 along the sectional line AA' and along the sectional line BB', respectively. As shown in the figures, wet etching is performed to selectively remove the remaining first semiconductor layer 110 and form a cavity 112 between the isolation structure 123 and the support structure 131 below the device stack. The cavity 112 was previously filled with the part of the first semiconductor layer 110 projected to below the device stack. As the material of the first semiconductor layer 110 is different from that of the substrate 130, the base region 101 and the support structure 123, the remaining first semiconductor layer 110 can be removed by etching with a corresponding etching solution. The first semiconductor layer 110 outsides the support isolation structure 123 are firstly etched by the etching solution, and then the first semiconductor layer 110 located between the support isolation structure 123 and the substrate 130 is removed. At this time, in the middle portion in the width of the semiconductor structure, a gap is formed between the support isolation structure 123 and the substrate 130, and the first semiconductor layer 110 below the device stack is further etched by the etching solution through the gap, until all the first semiconductor layer 110 is completely removed, and a cavity 112 is formed between the support isolation structure 123 and the substrate 130 below the device stack. At this time, as shown in FIG. 14a, as for the region where a first semiconductor layer 110 previously exists between the support isolation structure 123 and the substrate 130, after the first semiconductor layer 110 is removed, a gap is formed between the support isolation structure 123 and the substrate 130; and as shown in FIG. 11b, as for the region where a first semiconductor layer 110 previously does not exist between the support isolation structure 123 and the substrate 130, the support isolation structure 123 is connected to the substrate 130.

In step S110, the second spacer 260 is removed, and a source/drain region is formed on both sides of the device stack.

Specifically, as shown in FIG. 15, FIG. 15a and FIG. 15b, FIG. 15 is a schematic top view after removing a first semiconductor layer 110 to form a cavity 112 below the gate stack, and FIG. 15a and FIG. 15b are schematic sectional views of FIG. 15 along the sectional line AA' and along the sectional line BB', respectively. As shown in the figures, the etching stop layer 250 is used as the etching stop layer to remove the second spacer 260 by a dry etching method; then, the first spacer 240 is used as an etching stop layer to further remove the etching stop layer 250 by a dry etching method so as to expose the substrate; and a stress material is filled on both sides of the device to form a source/drain region 113, wherein the upper surface of the source/drain region 130 is preferably higher than or at the same level as the bottom of the gate stack. Due to the presence of the isolation structure 123, the stress material is substantially located outsides the isolation structure 123 so as to ensure that the cavity 112 is not filled. As shown in FIG. 15a, in the region where the isolation structure 123 does not directly contact the substrate 130, since a certain gap is formed between the isolation structure 123 and the substrate 130, a small amount of stress materials will entered into the cavity 112 from the gap and are accumulated to form a barrier after entering into the gap. As a result, only the small amount of stress materials enter into the cavity 112, and a majority of stress materials are excluded outside. As shown in FIG. 15b, in the region where the isolation structure 123 and the substrate 130 are connected, the stress material is completed blocked outside the cavity 112 by the isolation structure 123.

The method of forming the source/drain region 113 is preferably epitaxial growth. As for PFET devices, the material of the source/drain region 113 is boron-doped $Si_{1-x}Ge_x$, wherein X ranges from 0.1 to 0.7, such as 0.2, 0.3, 0.4, 0.5 or 0.6; and as for NFET devices, the material of the source/drain region 113 is phosphorus or arsenic-doped Si:C, wherein the percentage of C ranges from 0.2% to 2%, such as 0.5%, 1% or 1.5%. The presence of the stress material silicon germanium or silicon carbide is advantageous for further regulating the stress within the channel region so as to enhance the mobility of carriers within the channel region. Besides, due to the presence of silicon germanium or silicon carbide, for PFET devices, after filling of a doped stress material, an N-type super steep retrograde well is formed; and for NFET devices, after filling of a doped stress material, a P-type super steep retrograde well is formed.

Compared with the prior art, the present invention has the following advantages. Since a cavity is formed below the channel, the stress of the stress material source/drain region located on both sides of the channel may more centrally apply to the channel, thereby effectively enhancing the impact of stress on the channel carrier mobility and enhancing control on the channel performance. Furthermore, the presence of the cavity below the channel is also beneficial to enhance the steepness of the source/drain region, thereby suppressing the short channel effect and improving the performance of the semiconductor structure.

While the exemplary embodiments and advantages thereof have been described in detail, it should be understood that various changes, substitutions and modifications can be made to these embodiments without departing from the spirit of the invention and the scope of protection defined by the appended claims. For other examples, those skilled in the art should readily understand that the order of process steps can be varied while maintaining the scope of protection of the present invention.

In addition, the range of applications of the present invention is not limited to the processes, institutions, manufacturing, composition of matter, means, methods and steps of the specific embodiments described in the description. In accordance with the disclosure of the present invention, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present invention, they can be applied in accordance with the present invention. Accordingly, the appended claims of the present invention seek to include these processes, institutions, manufacturing, composition of matter, means, methods, or steps within the scope of its protection.

The invention claimed is:
1. A method for manufacturing a semiconductor structure, comprising the steps of:
 a) providing a substrate (130) on which a gate stack and a first spacer (240) surrounding the gate stack are formed;
 b) removing part of the substrate (130) located on both sides of the gate stack to form a device stack;
 c) forming a second spacer (260) on both sides of the device stack;
 d) using the device stack with the second spacer (260) as a mask to etch the substrate located on both sides of the device stack so as to form a recess (160) located on both sides of the device stack and a support structure (131) below the device stack, wherein by controlling etching, a lateral cross-section of the recess has a sigma-shape, a vertex of which is projected to below the device stack;
 e) forming a first semiconductor layer (110) to fill the recess;
 f) removing part of the first semiconductor layer (110) located on both sides of the device stack to keep a first semiconductor layer (110) having a certain thickness;
 g) in a partial region along a width direction of the device stack, removing the first semiconductor layer (110) located on both sides of the device stack so as to expose the substrate (130);

h) in the partial region along the width direction of the device stack, forming an isolation structure (123) connected to the substrate below the second spacer (260) and edges on both sides of the device stack;

i) removing the remaining first semiconductor layer (110) to form a cavity (112) between the support structure (131) and the isolation structure (123); and j) removing the second spacer (260), and forming a source/drain region on both sides of the device stack.

2. The method according to claim 1, wherein the source/drain region comprises a stress material.

3. The method according to claim 1, wherein a source/drain region is formed by epitaxial growth.

4. The method according to claim 1, wherein the partial region along the width direction of the device stack is end regions along the width direction of the device stack.

5. The manufacturing method according to claim 1, wherein:

the material of the first semiconductor layer (110) is different from that of the substrate (130).

6. The method according to claim 1, wherein the step b) comprises:

etching the substrate (130) using the gate stack as a mask to form a base region (100) below the gate stack, wherein the base region (100) and the gate stack constitutes a device stack.

* * * * *